(12) United States Patent
Kwon et al.

(10) Patent No.: US 10,574,232 B2
(45) Date of Patent: Feb. 25, 2020

(54) CONTROL APPARATUS USING DIAL, MANUFACTURING METHOD OF CONTROL APPARATUS USING DIAL AND VEHICLE INCLUDING THE SAME

(71) Applicant: Hyundai Motor Company, Seoul (KR)

(72) Inventors: Gideok Kwon, Seoul (KR); Jong Bok Lee, Suwon-si (KR); Donghee Seok, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 15/382,407

(22) Filed: Dec. 16, 2016

(65) Prior Publication Data

US 2018/0091144 A1 Mar. 29, 2018

(30) Foreign Application Priority Data

Sep. 26, 2016 (KR) .................. 10-2016-0123145

(51) Int. Cl.
*H03K 17/96* (2006.01)
*H03K 17/975* (2006.01)
*B60K 35/00* (2006.01)
*B60K 37/06* (2006.01)
*H01R 43/20* (2006.01)

(52) U.S. Cl.
CPC .......... *H03K 17/962* (2013.01); *B60K 35/00* (2013.01); *B60K 37/06* (2013.01); *H01R 43/20* (2013.01); *H03K 17/975* (2013.01); *B60K 2370/126* (2019.05); *B60K 2370/145* (2019.05); *B60K 2370/1446* (2019.05);
(Continued)

(58) Field of Classification Search
CPC ............... H03K 17/962; H03K 17/975; H03K 2217/94073; H03K 2217/960755; B60K 37/06; B60K 2350/102; H01R 43/20
USPC ......................................................... 200/600
See application file for complete search history.

(56) References Cited

U.S. PATENT DOCUMENTS 6,696,173 B1  2/2004 Naundorf et al.
7,060,421 B2  6/2006 Naundorf et al.
(Continued)

FOREIGN PATENT DOCUMENTS

JP  2001033276 A  2/2001
JP  2009021117 A  1/2009
(Continued)

OTHER PUBLICATIONS

Paik, Byoung Man, et al., "Study on the Formation Mechanism of Electroless Plating Seeds on Polymer by Laser," Journal of the Korean Society for Precision Engineering, vol. 29, No. 1, pp. 41-47, Jan. 2012, 9 pages.

*Primary Examiner* — Edwin A. Leon
*Assistant Examiner* — Lheiren Mae A Caroc
(74) *Attorney, Agent, or Firm* — Slater Matsil, LLP

(57) ABSTRACT

Disclosed herein is a control apparatus using a dial. The control apparatus includes a sensor panel installed to be rotatable and movable up and down. A plurality of first electrodes is disposed in a surface of the sensor panel. The plurality of first electrodes is spaced apart at a predetermined distance in a circumferential direction. A first sensing electrode faces the sensor panel. The first sensing electrode is configured to be capacitively coupled with the plurality of first electrodes to sense a change in capacitance.

17 Claims, 13 Drawing Sheets

(52) U.S. Cl.
CPC ............... *B60K 2370/573* (2019.05); *H03K 2217/94073* (2013.01); *H03K 2217/960755* (2013.01)

(56) References Cited

U.S. PATENT DOCUMENTS

| | | | |
|---|---|---|---|
| 7,361,854 B2 | 4/2008 | Basche et al. | |
| 8,294,049 B2 * | 10/2012 | Tsuduki | H01H 25/065 200/5 R |
| 2009/0261962 A1 | 10/2009 | Buck et al. | |
| 2013/0206595 A1 | 8/2013 | Lee et al. | |
| 2014/0021024 A1 * | 1/2014 | Heimann | G05G 5/065 200/4 |
| 2015/0241195 A1 * | 8/2015 | Schenkewitz | H03K 17/975 324/658 |

FOREIGN PATENT DOCUMENTS

| | | |
|---|---|---|
| JP | 2010287351 A | 12/2010 |
| JP | 2013542428 A | 11/2013 |
| KR | 20000068595 A | 11/2000 |
| KR | 1020010040872 A | 5/2001 |
| KR | 20040021614 A | 3/2004 |
| KR | 20070016096 A | 2/2007 |
| KR | 1020160046698 A | 4/2016 |
| WO | 2014177918 A1 | 11/2014 |

\* cited by examiner

CONTROL APPARATUS USING DIAL, MANUFACTURING METHOD OF CONTROL APPARATUS USING DIAL AND VEHICLE INCLUDING THE SAME

CROSS-REFERENCE TO RELATED APPLICATIONS

This application claims the benefit of Korean Patent Application No. 10-2016-0123145, filed on Sep. 26, 2016 in the Korean Intellectual Property Office, the disclosure of which is incorporated herein by reference.

TECHNICAL FIELD

Embodiments of the present disclosure relate to a control apparatus using a dial, manufacturing method of the control apparatus using a dial, and a vehicle including the same.

BACKGROUND

As multimedia devices used in vehicles have been diversified and the functions of the multimedia devices have also increased, the user's operational complexity has increased. Thus, as part of an effort to simplify the multimedia devices, an interface for unified operations has been increasingly applied. A representative example of the interface may be a control apparatus using a dial such as a jog dial, etc.

In general, when a passenger intentionally rotates a control apparatus using a dial in a forward or reverse direction, the control apparatus using a dial comes in mechanoelectrical contact during a rotation process to realize selection of functions of, and thus operation, etc. of the multimedia devices used in vehicles.

When the control apparatus using a dial needs to search for a list or continuously change values, the control apparatus has advantages in that it has a shorter running time, is very easier to use, and instinctively operable, compared to button-type input devices.

SUMMARY

Embodiments of the present invention describe a control apparatus using a dial capable of measuring a rotation angle and a depth in a z-axial direction, a manufacturing method of the control apparatus using a dial, and a vehicle including the same.

Therefore, it is an aspect of the present disclosure to provide a control apparatus using a dial capable of realizing both a rotary wheel function and a function of measuring a depth in a z-axial direction using one module, a manufacturing method of the control apparatus using a dial, and a vehicle including the same.

Additional aspects of the disclosure will be set forth in part in the description which follows and, in part, will be obvious from the description, or may be learned by practice of the disclosure.

According to one aspect of the present disclosure, a control apparatus using a dial includes a sensor panel installed to be rotatable and movable up and down through the user's operation, a plurality of first electrodes disposed in a surface of the sensor panel to be spaced apart at a predetermined interval in a circumferential direction, and a first sensing electrode disposed to be spaced apart to face the sensor panel so as to interact with the plurality of first electrodes to sense a change in capacitance. Here, the first sensing electrode sequentially reacts with the plurality of first electrodes to sense the number of rotations of the sensor panel when the sensor panel is rotated and to sense a pushing pressure of the sensor panel based on the capacitance change values in response to the intervals between the sensor panel and the plurality of first electrodes when the sensor panel is pushed.

Also, the sensor panel may include a metal complex, and the plurality of first electrodes may be formed in electrode grooves by plating or deposition. In this case, the electrode grooves may be formed in the sensor panel by irradiation with a laser.

In addition, the metal complex may include one or more resins selected from the group consisting of a polycarbonate (PC), a polyamide (PA), and an acrylonitrile-butadiene-styrene (ABS) copolymer, and one or more metal oxides selected from the group consisting of Mg, Cr, Cu, Ba, Fe, Ti, and Al.

Additionally, one of the plurality of first electrodes and the first sensing electrode may be disposed to face each other when an external force is not applied to the sensor panel.

Also, the control apparatus using a dial may include a positioning unit configured to position the first electrodes and the first sensing electrode to face each other when an external force is not applied to the sensor panel. In this case, the positioning unit may include a concavo-convex portion formed on a member moving with the sensor panel, and a ball supported by a spring to move along the concavo-convex portion as the sensor panel is rotated.

In addition, the control apparatus using a dial may include a plurality of second electrodes disposed between the plurality of first electrodes in a circumferential direction of the sensor panel and having a relatively smaller area than the first electrodes.

Additionally, the control apparatus using a dial may further include a second sensing electrode configured to sense a rotation direction of the sensor panel through interaction between the plurality of first electrodes and the plurality of second electrodes when the sensor panel is rotated.

Also, the second sensing electrode may be disposed to face a surface of the sensor panel disposed between the first electrodes and the second electrodes when an external force is not applied to the sensor panel.

In addition, the control apparatus using a dial may include a control knob including a body section to which the sensor panel is coupled, a grip section formed along an outer circumference of the body section, and a rotation supporting section extending from a lower portion of the body section. In this case, the rotation supporting section may be rotatably press-fitted into a shaft section protruding upward from a base, and an elastic member configured to apply a pressure to the control knob in an upper direction may be disposed between the shaft section and the rotation supporting section.

Additionally, the plurality of second electrodes may be formed in electrode grooves by plating or deposition. In this case, the electrode grooves may be formed in the sensor panel by irradiation with a laser.

According to another aspect of the present disclosure, a vehicle including a control apparatus using a dial includes a sensor panel installed to be rotatable and movable up and down through the user's operation, a plurality of first electrodes disposed in a surface of the sensor panel to be spaced apart at a predetermined interval in a circumferential direction, a first sensing electrode disposed to be spaced apart to face the sensor panel so as to interact with the plurality of first electrodes to sense a change in capacitance, and a control unit electrically connected to the first sensing electrode and configured to receive information transmitted from the first sensing electrode to determine information on capacitance.

Also, the vehicle may further include a plurality of second electrodes disposed between the plurality of first electrodes in a circumferential direction of the sensor panel and having a relatively smaller area than the first electrodes, and a second sensing electrode configured to sense a rotation direction of the sensor panel through interaction between the plurality of first electrodes and the plurality of second electrodes when the sensor panel is rotated.

In addition, the control unit may control operation of one or more of an air conditioning system for vehicles, a clock, an audio device, and a navigation system, based on the information on the capacitance.

According to still another aspect of the present disclosure, a manufacturing method of the control apparatus using a dial is provided. Here, the control apparatus using a dial includes a plurality of first electrodes disposed in a surface of a sensor panel, which is installed to be rotatable and movable up and down, to be spaced apart at a predetermined interval in a circumferential direction, and a first sensing electrode disposed to be spaced apart to face the sensor panel so as to interact with the plurality of first electrodes to sense a change in capacitance. In this case, at least one of the plurality of first electrodes and the first sensing electrode may be manufactured by forming electrode grooves to which a metal seed is exposed by irradiating a material including a metal complex with a laser, and then forming a conductor in the electrode grooves through a plating or deposition process.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION OF ILLUSTRATIVE EMBODIMENTS

Figure 1:
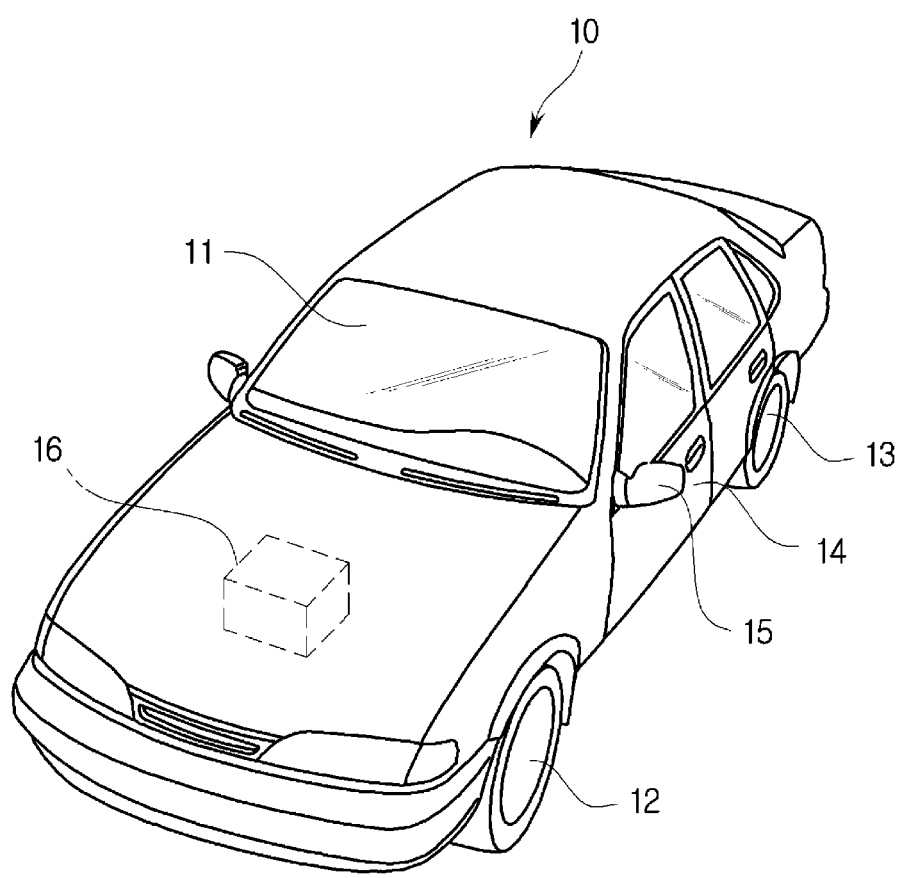
FIG. 1 is an outline diagram of a vehicle according to one embodiment of the present disclosure.

Reference will now be made in detail to the embodiments of the present disclosure, examples of which are illustrated in the accompanying drawings, wherein like reference numerals refer to like elements throughout.

FIG. 1 is an outline diagram of a vehicle according to one embodiment of the present disclosure.

Referring to FIG. 1, the vehicle according to one embodiment of the present disclosure includes a main body 10 forming the appearance of the vehicle, wheels 12 and 13 configured to move the vehicle, a drive unit 16 configured to rotate the wheels 12 and 13, doors 14 configured to shield the inside of the vehicle from the outside, a front window 11 configured to provide a front view of the vehicle to a driver in the vehicle, and side-view mirrors 15 configured to provide a rear view of the vehicle to the driver.

The wheels 12 and 13 include front wheels 12 provided in the front of the vehicle, and rear wheels 13 provided in the rear of the vehicle, and the drive unit 16 transmits a rotational force to the front wheels 12 or rear wheels 13 so that the main body 10 moves forward or backward. Such a drive unit 16 may use an engine configured to generate a rotational force from the combustion of fossil fuels, or a motor configured to generate a rotational force by receiving power from an electrical condenser (not shown).

The doors 14 are pivotally provided on the left and right of the main body 10 so as to allow a driver to get in the vehicle when the doors 14 are open and shield the inside of the vehicle from the outside when the doors 14 are closed.

The front window 11 is provided at a front upper side of the main body 10 so that a driver in the vehicle gets information on front views of the vehicle, and thus is referred to as a windshield.

Also, the side-view mirrors 15 include a left side-view mirror provided on the left of the main body 10, and a right side-view mirror provided on the right of the main body 10. In this case, the driver in the vehicle may obtain information on front and rear views of the vehicle.

In addition, the vehicle may include sensors such as a proximity sensor configured to sense obstacles and other vehicles therebehind, a rain sensor configured to sense whether it is raining or not, and the amount of rainfall, etc.

By way of one example, the proximity sensor sends a sensing signal to the sides or rear of the vehicle, and receives a reflection signal reflected by obstacles such as other vehicles, etc. Also, the proximity sensor may sense whether there is an obstacle behind the vehicle and detect a location of the obstacle, based on the waveform of the received reflection signal. Such a proximity sensor may make use of a method of sending ultrasonic waves and detecting a distance from the obstacle using the ultrasonic waves reflected by the obstacle.

Figure 2:
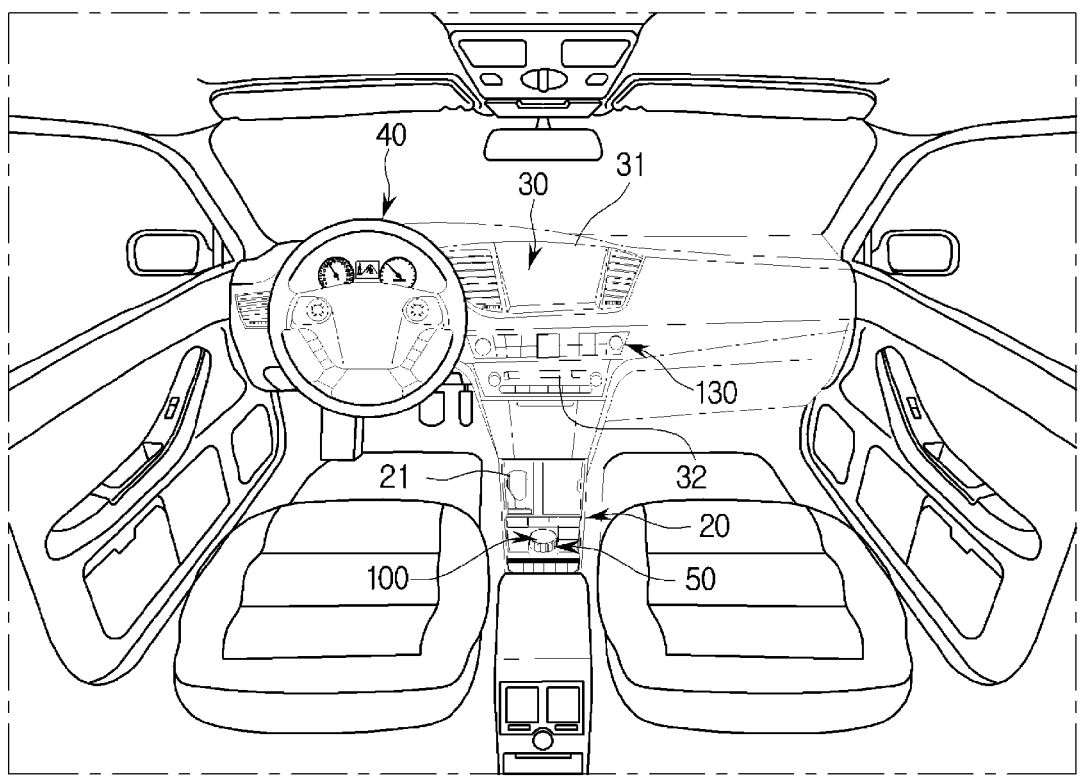
FIG. 2 is a diagram showing an internal configuration of the vehicle according to one embodiment of the present disclosure.
Figure 3:
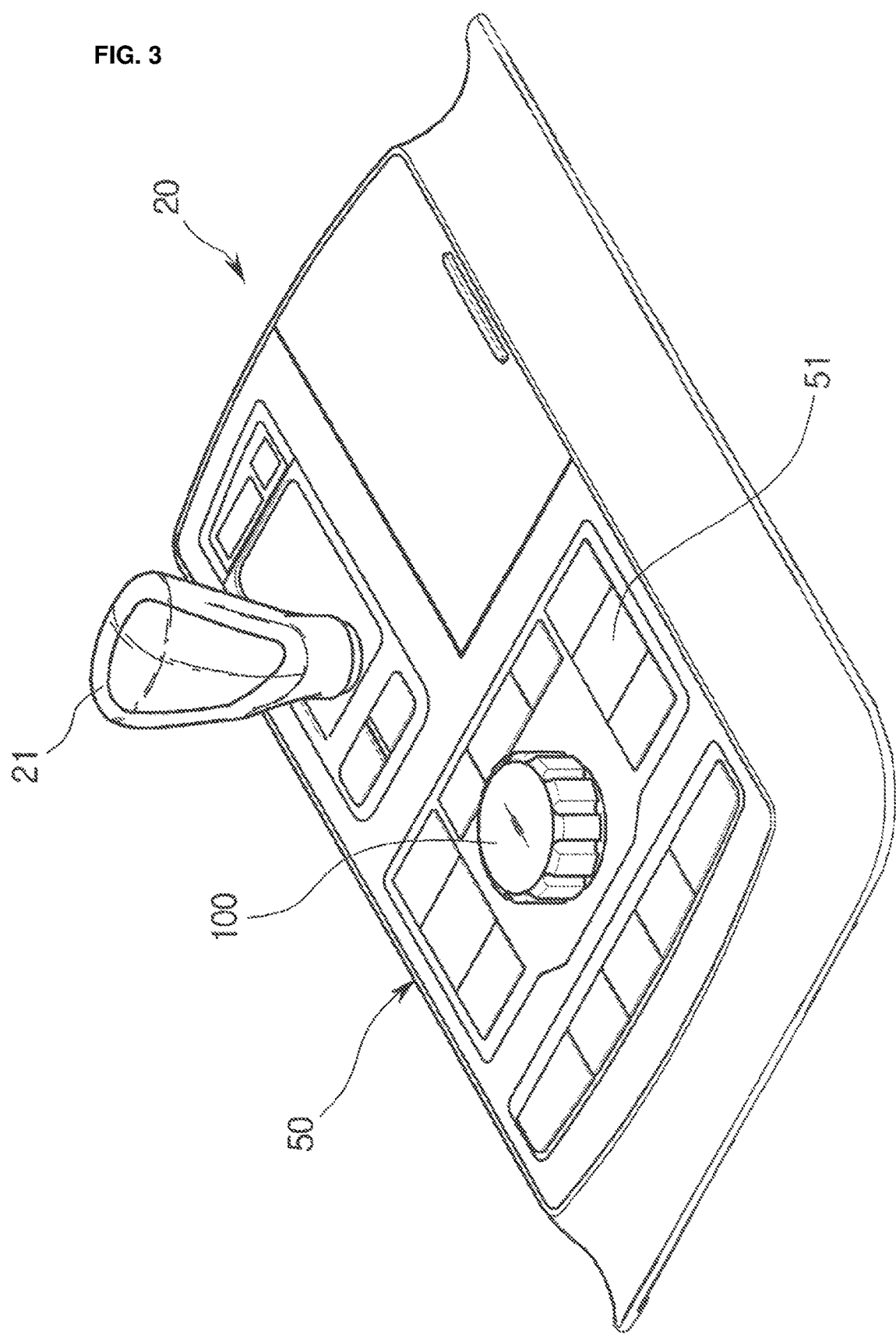
FIG. 3 is a diagram showing a gearbox according to one embodiment of the present disclosure.

FIG. 2 is a diagram showing an internal configuration of a vehicle according to one embodiment of the present disclosure, and FIG. 3 is a diagram showing a gearbox according to one embodiment of the present disclosure.

As shown in FIG. 2, the vehicle may include a gearbox 20, a center fascia 30, and a dashboard provided with a steering wheel 40, etc.

A gearshift 21 for transmission of the vehicle is installed in the gearbox 20. Also, as shown in the drawing, an input device 50 configured to allow a user to control functioning of a navigation system 31 or main parts of the vehicle may be installed in the gearbox 20.

An air conditioning system, a clock, an audio device, and the navigation system 31 may be installed in the center fascia 30. The air conditioning system keeps the inside of the vehicle fresh by controlling the temperature, the humidity, the air cleanliness, and the air flow inside the vehicle. The air conditioning system may include at least one discharge port installed at the center fascia 30 and configured to discharge air. A button or a dial configured to control the air conditioning system and the like may be installed in the center fascia 30. A user such as a driver may control the air conditioning system in the vehicle using the button or dial disposed in the center fascia 30.

According to embodiments, the navigation system 31 may be installed in the center fascia 30. The navigation system 31 may be formed to be buried in the center fascia 30 of the vehicle. According to one embodiment, an input unit configured to control the navigation system 31 may also be installed in the center fascia 30. According to embodiments, the input unit of the navigation system 31 may be installed in a position other than the center fascia 30. For example, the input unit of the navigation system 31 may also be formed in the vicinity of a display section of the navigation system 31. By way of another example, the input unit of the navigation system 31 may be installed at the gearbox 20, etc.

The steering wheel 40 is a device configured to control a driving direction of the vehicle, and may include a rim gripped by a driver, and a spoke coupled to a steering apparatus of the vehicle and configured to connect the rim to a hub of a rotating shaft for steering. According to embodiments, various devices in the vehicle, for example, an operating device configured to control an audio device, and the like may be formed at the spoke.

Also, according to embodiments, the dashboard may further include various instrument panels capable of displaying a running speed of the vehicle, the number of rotations of an engine, or a residual fuel level, a glove box capable of accommodating various articles, etc.

An audio device 32 includes an operation panel provided with a plurality of buttons to perform various functions. The audio device may offer a radio mode for providing a radio function, and a media mode for playing audio files in various storage media including the audio files. The buttons formed in the operation panel of the audio device 32 may be divided into buttons configured to provide functions associated with execution of the radio mode, buttons configured to provide functions associated with execution of the media mode, and buttons commonly used for both modes.

Figure 4:
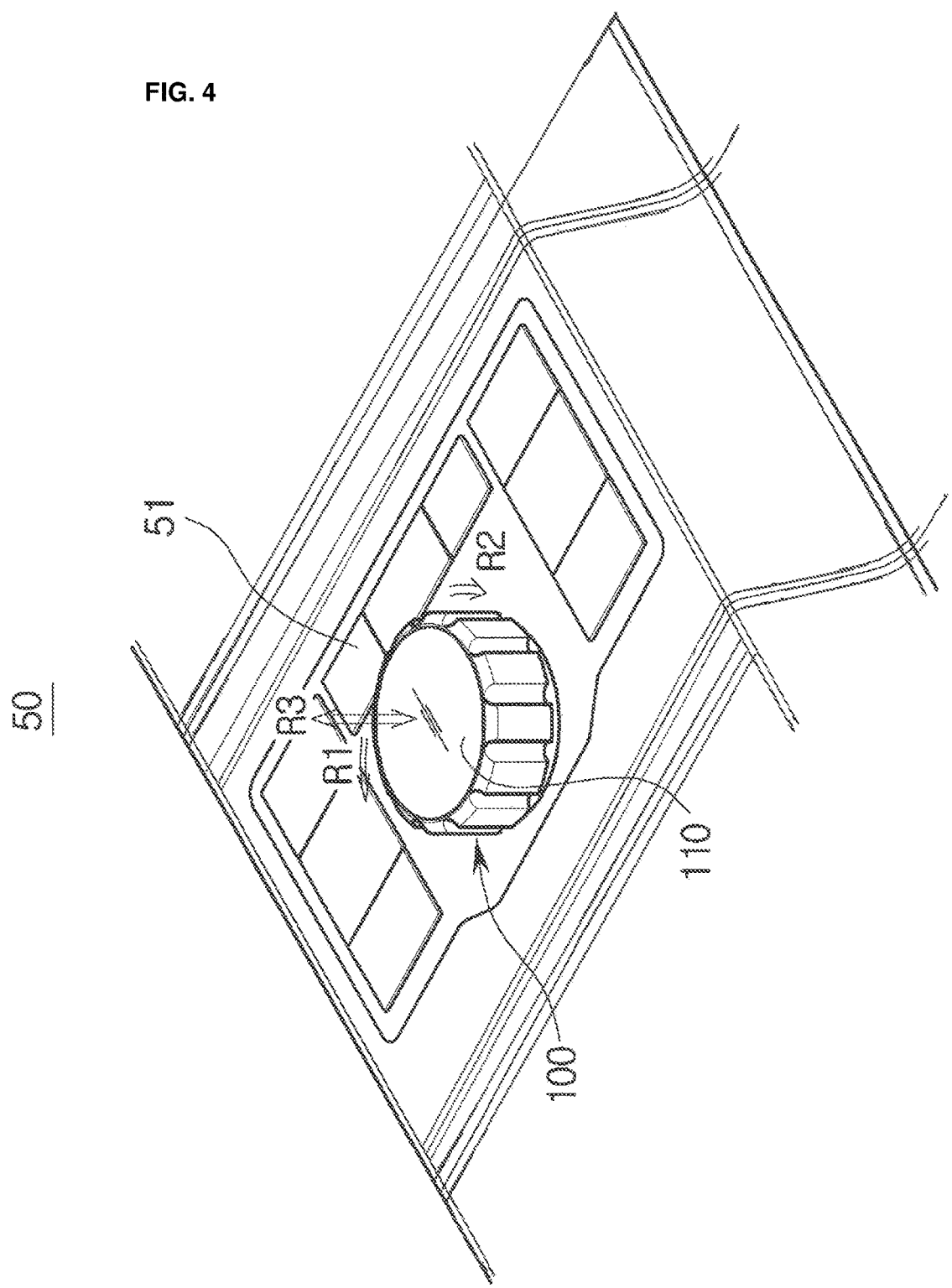
FIG. 4 is a diagram showing an input device according to one embodiment of the present disclosure.

Referring to FIG. 4, an input device according to one embodiment of the present disclosure will be described in detail. FIG. 4 is a diagram showing an input device according to one embodiment of the present disclosure.

The input device 50 according to one embodiment of the present disclosure includes a control apparatus 100 using a dial capable of carrying out a rotation operation. As shown in FIG. 3, the control apparatus 100 using a dial may be installed at the gearbox 20 in the vehicle. The gearbox 20 may be generally installed between a driver seat and a passenger seat inside the vehicle, and a gearshift 21 for transmission, and various parts associated with the transmission may be installed or mounted thereinside.

According to embodiments, various buttons may be installed outside the gearbox 20. The control apparatus 100 using a dial may be provided in a knob type capable of being gripped by a user and carrying out a rotation operation. Also, various buttons 51 configured to assist the function of the control apparatus 100 using a dial or perform separate independent functions thereof may be provided in the vicinity of the control apparatus 100 using a dial.

As shown in FIG. 4, the control apparatus 100 using a dial may be provided to carry out a rotation operation in predetermined directions R1 and R2 along a predetermined axis of rotation and move up an down in a vertical direction R3, thereby carrying out a pushing operation. A user may operate the control apparatus 100 using a dial to rotate the control apparatus 100 using a dial, or may push the control apparatus 100 using a dial to input predetermined instructions or commands.

The control apparatus 100 using a dial may have various parts associated with the operation mounted therein. A rotating shaft member coupled to rotate and move the control apparatus 100 using a dial up and down, and various parts associated with the rotating shaft member, for example, bearings, springs, and the like may be installed inside the control apparatus 100 using a dial.

Also, various semiconductor chips and a printed circuit board may be installed inside the control apparatus 100 using a dial. The semiconductor chips may be installed at the printed circuit board. The semiconductor chips may perform information processing or store data. The semiconductor chips may analyze a predetermined electrical signal generated through movement of the control apparatus 100 using a dial or operation of buttons formed in the control apparatus 100 using a dial, generate a predetermined control signal in response to the analyzed contents, and transmit the control signal to a control unit, a display section, etc.

Figure 5:
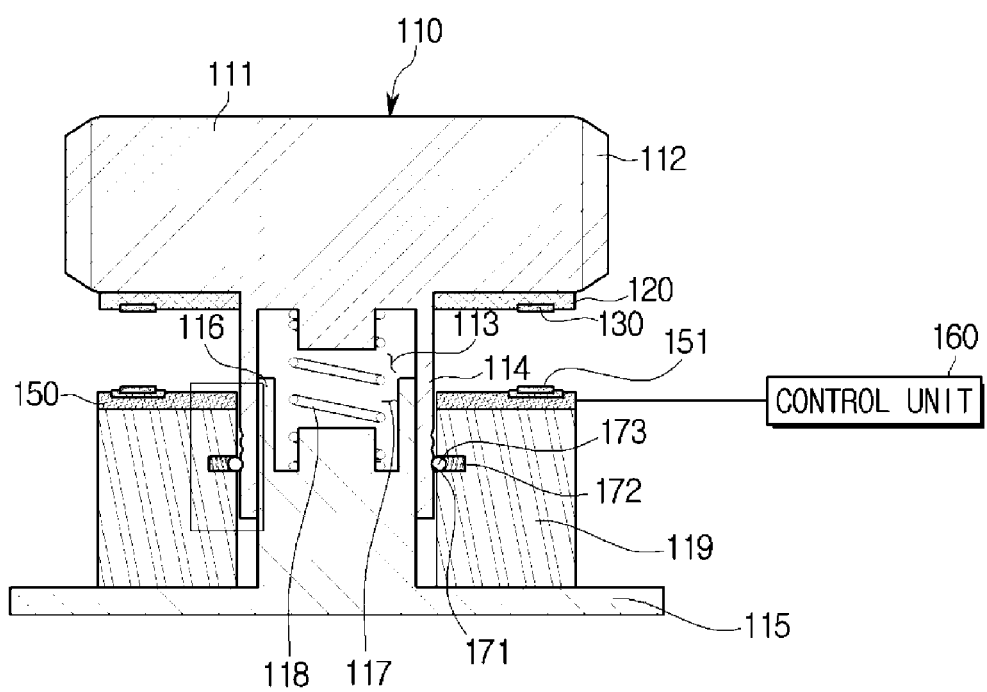
FIG. 5 is a cross-sectional view schematically showing an inner part of a control apparatus using a dial according to one embodiment of the present disclosure.
Figure 6:
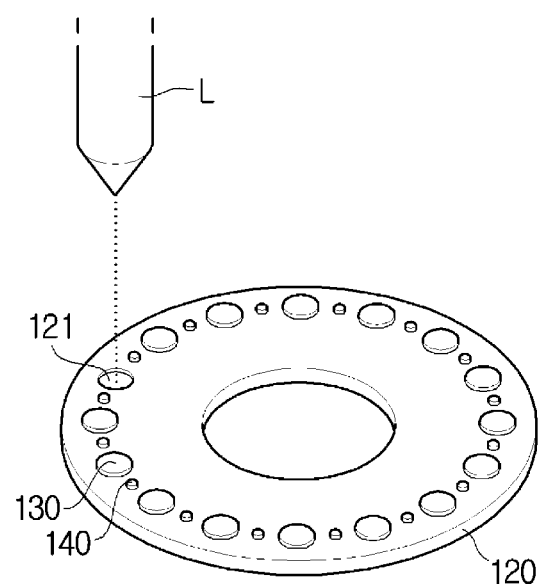
FIG. 6 is a diagram showing a sensor panel and a manufacturing process of the sensor panel according to one embodiment of the present disclosure.
Figure 7:
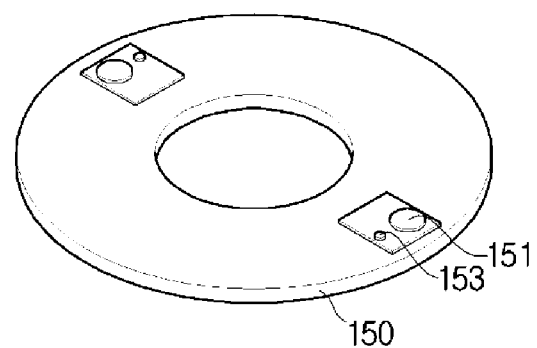
FIG. 7 is a diagram showing a sensing terminal according to one embodiment of the present disclosure.

FIG. 5 is a cross-sectional view schematically showing an inner part of a control apparatus using a dial according to one embodiment of the present disclosure, FIG. 6 is a diagram showing a sensor panel and a manufacturing process of the sensor panel according to one embodiment of the present disclosure, and FIG. 7 is a diagram showing a sensing terminal according to one embodiment of the present disclosure. The control apparatus using a dial shown in FIG. 5 is one example of a structure capable of being rotatable and movable up and down, but the present disclosure is not limited thereto.

Referring to FIGS. 5 to 7, a sensor panel 120 coupled to a bottom surface of a control knob 110 to move with the control knob 110 as the control knob 110 is rotated and is pushed is provided inside the control apparatus 100 using a dial.

The control knob 110 includes a cylindrical body section 111, and a grip section 112 formed along an outer circumference of the body section 111.

A cylindrical rotation supporting section 114 having a hollow portion 113 may be formed to extend downward from the body section 111, and a shaft section 116 protruding upward from a base 115 may be inserted into the hollow portion 113 of the rotation supporting section 114.

A hollow groove 117 may be formed inside the shaft section 116, and an elastic member 118 configured to elastically support the control knob 110 may be disposed in the groove 117.

The elastic member 118 provides an elastic force to apply a pressure to the control knob 110 in an upper direction, and then returns the control knob 110 to its original position when an external force is removed after a user pushes the control knob 110.

The sensor panel 120 may be coupled to a bottom surface of the control knob 110, and may integrally move with the control knob 110.

The sensor panel 120 may be provided in a disc shape, and a plurality of first electrodes 130 disposed to be spaced apart at predetermined intervals in a circumferential direction around an edge of the sensor panel 120 may be formed on a bottom surface of the sensor panel 120.

The plurality of first electrodes 130 may be formed on the sensor panel 120 using a laser directing structure (LDS) process. Here, LDS process refers to a process which includes forming a support material using a material including a non-conductive and chemically stable metal complex, exposing a metal seed by exposing a portion of the support material to a laser such as an ultraviolet (UV) laser or an excimer laser to cleave a chemical bond in the metal complex, and metalizing the support material to form a conductive structure on a portion of the support material exposed to the laser. Such an LDS process is disclosed in Korean Registered Patent No. 374667, and Korean Patent Publication Nos. 2001-40872 and 2004-0021614, the contents of which are incorporated herein by reference.

For this purpose, the sensor panel 120 may be made of a metal complex. By way of one example, the sensor panel 120 may be a complex including a resin and a metal oxide.

Here, the resin may include one or more selected from the group consisting of a polycarbonate (PC), a polyamide (PA), and an acrylonitrile-butadiene-styrene (ABS) copolymer, and the metal oxide may include one or more selected from the group consisting of Mg, Cr, Cu, Ba, Fe, Ti, and Al.

The plurality of first electrodes 130 may be formed of a conductor coupled to electrode grooves 121 through a plating or deposition process. Here, the electrode grooves 121 may be formed in the sensor panel 120 by irradiation with a laser L.

Specifically, the electrode grooves 121 are generated in the sensor panel 120 due to heat generated by irradiation with a laser, the sensor panel 120 is reduced into a metal by the generated heat, and a portion of the sensor panel 120 reduced into the metal forms a metal seed in the electrode grooves 121.

The first electrodes 130 may be formed on the electrode grooves 121 by plating. A process of coating a metal seed may be performed using a plating technique generally known in the art, and thus a description thereof is omitted. Also, the first electrodes 130 may be formed using a deposition process. Further, the first electrodes 130 may also be formed using a combination of the plating and deposition processes.

The first electrodes 130 may include a copper (Cu) plating. In this case, the copper plating may be plated with nickel (Ni), and subjected to anti-oxidation treatment. Also, conductivity may be improved through use of gold (Au) plating.

Alternatively, although not shown, the sensor panel 120 may be formed by coating one surface of a base material, and the base material may include a resin, glass, or leather.

The base material may have a hard or elastic surface. Also, the base material may not be modified due to hardness, and may also be formed of a flexible material.

Also, the base material may be formed using an injection molding method. After the base material is manufactured by injection, a top or bottom surface of the base material may be coated with the sensor panel 120 including a metal oxide.

A plurality of second electrodes 140 disposed between the plurality of first electrodes 130 and disposed to be spaced apart in a circumferential direction may be provided on the sensor panel 120.

The plurality of second electrodes 140 may be formed using an LDS process, like the plurality of first electrodes 130.

The second electrodes 140 may have a relatively smaller diameter than the first electrodes 130. Also, the second electrodes 140 may be formed to have a relatively smaller area than the first electrodes 130. Such second electrodes 140 may be used to detect a rotation direction of the sensor panel 120. Thus, such a configuration will be described below.

A substrate 150 may be disposed under the sensor panel 120. Here, a first sensing electrode 151 disposed to be spaced apart to face the plurality of first electrodes 130 so as to interact with the plurality of first electrodes 130 to sense a change in capacitance may be installed on the substrate 150.

The first sensing electrode 151 may be formed of a conductive material, for example, a metal. Also, among metals, copper (Cu) may be used in consideration of conductivity and economic feasibility. However, the first sensing electrode 151 may be formed of a metal such as gold (Au) in addition to the copper.

The first sensing electrode 151 may be provided by coating one surface of the substrate 150 with a base including a metal complex, or may be provided so that the substrate 150 includes a metal complex. Also, a groove in which the first sensing electrode 151 is seated may be formed using a laser, and the first sensing electrode 151 may be formed in the formed groove using a plating or deposition process.

The first sensing electrode 151 interacts with the plurality of first electrodes 130 to sense a change in capacitance. For example, the first sensing electrode 151 senses a capacitance changing in response to the distance from the plurality of first electrodes 130 and the position of the plurality of first electrodes 130, and transmits information on the sensed capacitance to a control unit 160 electrically connected to the sensing electrodes.

Figure 8:
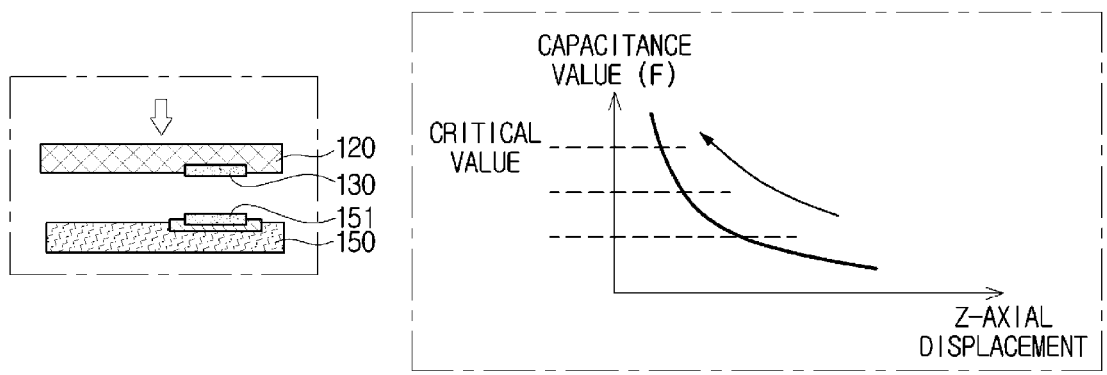
FIG. 8 is a diagram showing a change in capacitance when a control knob is pushed according to one embodiment of the present disclosure.

Hereinafter, a change in capacitance in response to interaction between the first electrodes and the first sensing electrode according to one embodiment of the present disclosure will be described. FIG. 8 is a diagram showing a change in capacitance value when a control knob is pushed according to one embodiment of the present disclosure, and FIG. 9 is a diagram showing a change in capacitance value when the control knob is rotated according to one embodiment of the present disclosure.

As shown in FIG. 8, when a user presses a control knob 110, an interval between the first electrodes 130 installed in the sensor panel 120 and the first sensing electrode 151 changes, and thus a capacitance value changes through interaction between the first electrodes 130 and the first sensing electrode 151.

Specifically, when the first electrodes 130 are brought closer to the first sensing electrode 151 due to a change in Z-axial displacement in response to the user's pushing pressure, a capacitance value increases, the control unit 160 calculates the user's pushing pressure through a change in capacitance value, and then perform functions of devices (for example, an air conditioning system, an audio device, a clock, a navigation system, etc.), based on the change in capacitance value.

Figure 9:
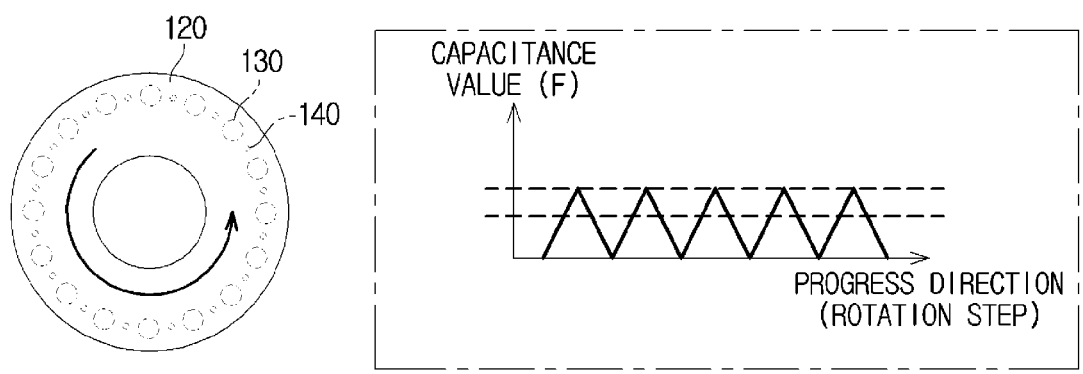
FIG. 9 is a diagram showing a change in capacitance when the control knob is rotated according to one embodiment of the present disclosure.

Meanwhile, as shown in FIG. 9, when a user rotates the control knob 110, the plurality of first electrodes 130 provided in the sensor panel 120 may be arranged to sequentially face the first sensing electrode 151 in a rotation direction of the sensor panel 120.

Pulses of the capacitance value may periodically change in such a rotation direction of the sensor panel 120, and the control unit 160 may calculate the number of rotations of the sensor panel 120, based on the number of the pulses.

Figure 10:
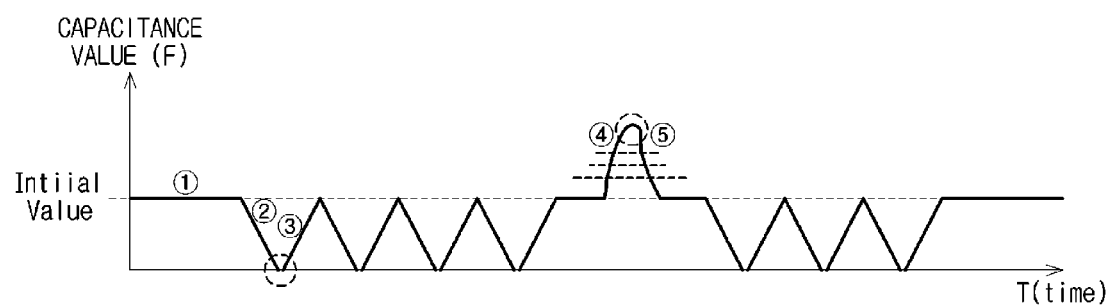
FIG. 10 is a diagram showing a change in capacitance when the control knob is pushed and rotated according to one embodiment of the present disclosure.

FIG. 10 is a diagram showing a change in capacitance by the first sensing electrode when the sensor panel is rotated and is pushed according to one embodiment of the present disclosure.

Referring to FIG. 10, when the control knob 110 is in an initial position (①), a capacitance value F is maintained as an initial value in a state in which one of the plurality of first electrodes 130 formed in the sensor panel 120 faces the first sensing electrode 151. In this case, the control knob 110 is in a state in which rotation and pushing operations are not performed.

Next, when a user rotates the sensor panel 120 through operation of the control knob 110, an initial state in which the first sensing electrode 151 faces one of the plurality of first electrodes 130 formed in the sensor panel 120 is changed into a state in which the first sensing electrode 151 strays away from one of the plurality of first electrodes 130. As a result, the capacitance value drops from the initial value (②). In this case, the first sensing electrode 151 is disposed to face a non-electrode material disposed between the plurality of first electrodes 130 formed in the sensor panel 120.

Also, when the sensor panel 120 is continuously rotated so that the first sensing electrode 151 moves past a halfway point between one of the plurality of first electrodes 130 and another adjacent one of the first electrodes 130, the capacitance value that has dropped to the minimum increases again (③). When the first sensing electrode 151 faces another one of the first electrodes 130, the capacitance value returns to the initial value.

Therefore, the control unit 160 may calculate the number of rotations of the sensor panel 120, based on the number of pulses.

Subsequently, when a user pushes the control knob 110 by applying a pressure to the control knob 110, the first electrodes 130 formed in the sensor panel 120 moves in a direction in which the first electrodes 130 are brought closer to the first sensing electrode 151, and thus the capacitance value sensed by the first sensing electrode 151 increases (④). In this case, a pushing operation of the control knob 110 may be configured to be realized when the first electrodes 130 and the first sensing electrode 151 are disposed to face each other. Such a configuration will be described below.

Then, when a user removes an external force applied to the control knob 110, the control knob 110 moves upward and returns to the original state, and thus the capacitance value between the first electrodes 130 and the first sensing electrode 151 drops and returns to the initial value (⑤).

Through this configuration, when both a rotary wheel function and a function of measuring a depth in a z-axial direction are realized in one structure according to the present disclosure, there is no need for a separate additional module. That is, since conventional rotary wheels are driven using an optical or magnetic method, apart from the rotary wheel module, another module should be added to measure a depth in a z-axial direction. Also, a rotary encoder is generally used to measure a direction and angle of a rotating object. In this case, the rotary encoder should use a Hall sensor or structure in the sensor panel during installation, and a separate package space is required to insert a sensor of a conventional encoder. However, in this embodiment, electrodes using an LDS may be used to measure an angle in a rotation direction and also a depth in an axial direction. Also, since the electrodes may be directly installed at a circuit board, a separate space for installing a sensor is not required.

Figure 11:
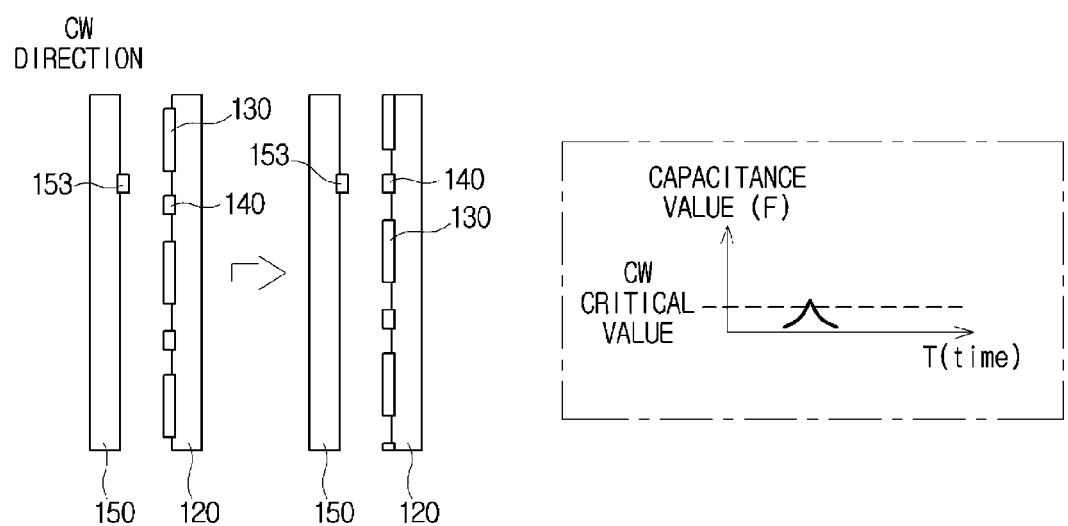
FIG. 11 is a diagram showing a change in capacitance when the control knob is rotated in a clockwise direction according to one embodiment of the present disclosure.
Figure 12:
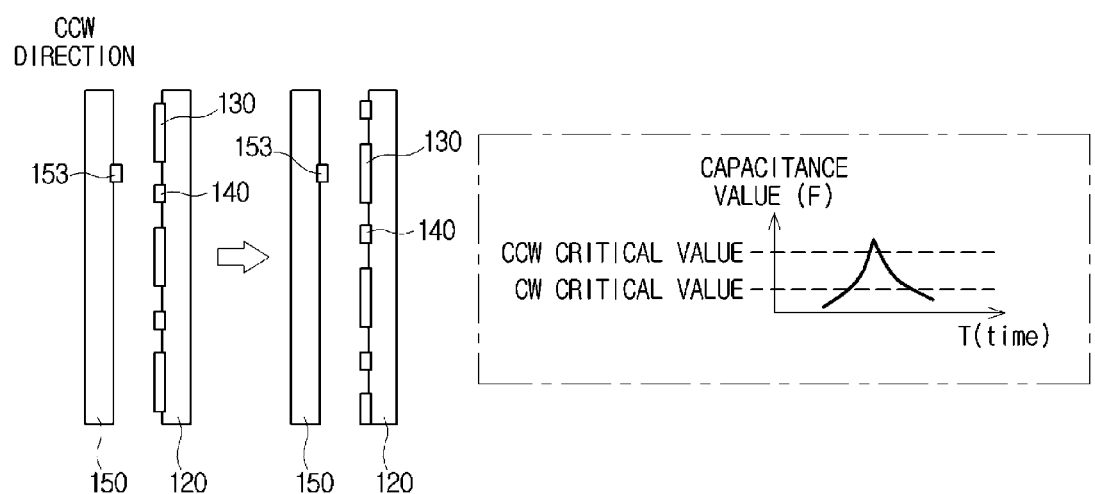
FIG. 12 is a diagram showing a change in capacitance when the control knob is rotated in a counterclockwise direction according to one embodiment of the present disclosure.

FIG. 11 is a diagram showing a change in capacitance when the control knob is rotated in a clockwise direction according to one embodiment of the present disclosure, and FIG. 12 is a diagram showing a change in capacitance when the control knob is rotated in a counterclockwise direction according to one embodiment of the present disclosure.

Referring to FIGS. 11 and 12, a second sensing electrode 153 configured to detect a rotation direction of the sensor panel 120 may be provided in a substrate 150.

The second sensing electrode 153 may be formed of a conductive material, for example, a metal. Also, among metals, copper (Cu) may be used in consideration of conductivity and economic feasibility. However, the first sensing electrode 151 may be formed of a metal such as gold (Au) in addition to the copper.

The second sensing electrode 153 may be provided by coating one surface of the substrate 150 with a base including a metal complex, or may be provided so that the substrate 150 includes a metal complex. Also, a groove in which the second sensing electrode 153 is seated may be formed using a laser, and the second sensing electrode 153 may be formed in the formed groove using a plating or deposition process.

The second sensing electrode 153 interacts with the plurality of electrodes 130 and 140 to sense a change in capacitance. For example, the second sensing electrode 153 senses a capacitance changing in response to the positions and areas of the plurality of electrodes 130 and 140, and transmits information on the sensed capacitance to a control unit 160 electrically connected to the second sensing electrode 153.

When such a second sensing electrode 153 is in an initial position, the second sensing electrode 153 in the substrate 150 is disposed in a position between the first electrodes 130 and the second electrodes 140 so that the second sensing electrode 153 does not face the first and second electrodes 130 and 140. When the sensor panel 120 is rotated, the second sensing electrode 153 interacts with the first electrodes 130 or the second electrodes 140 to sense information on capacitance.

Specifically, as shown in FIG. 11, when the sensor panel 120 is rotated in a clockwise direction, the second sensing electrode 153 first faces the second electrodes 140 to sense a pulse change of the capacitance value generated through the interaction with the second electrodes 140.

In this case, since the second electrodes 140 has a relatively smaller area than the first electrodes 130, the capacitance value sensed by the second sensing electrode 153 is relatively smaller than the capacitance value generated by the first electrodes 130. Thus, the second sensing electrode 153 senses a clockwise rotation, based on the critical value of the capacitance value.

On the other hand, as shown in FIG. 12, when the sensor panel 120 is rotated in a counterclockwise direction, the second sensing electrode 153 first faces the first electrodes 130 to sense a pulse change of the capacitance value generated the interaction with the first electrodes 130.

In this case, since the first electrodes 130 has a relatively higher area than the second electrodes 140, the capacitance value sensed by the second sensing electrode 153 is relatively higher than the capacitance value generated by the second electrodes 140. Thus, the second sensing electrode 153 senses a counterclockwise rotation, based on the critical value of the capacitance value.

Figure 13:
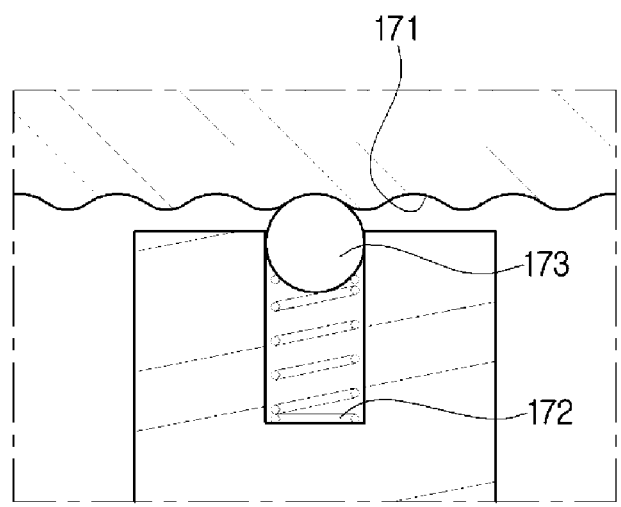
FIG. 13 is a diagram showing one example of a positioning unit configured to dispose a first electrode and a first sensing electrode to face each other when an external force is not applied to the control knob according to one embodiment of the present disclosure.

FIG. 13 is a diagram showing one example of a positioning unit configured to dispose a first electrode and a first sensing electrode to face each other when an external force is not applied to the control knob according to one embodiment of the present disclosure.

Referring to FIG. 13, a positioning unit 170 may include a concavo-convex portion 171, and a ball 173 moving along the concavo-convex portion 171 in a state in which the ball 173 is supported by a spring 172.

That is, the concavo-convex portion 171 in a wavy shape may be formed in a predetermined period on a member moving with the sensor panel 120, and the ball 173 moving along the concavo-convex portion 171 may be supported by the spring 172 in a sliding member and the member having the concavo-convex portion 171 formed therein.

In this embodiment, the member provided with the concavo-convex portion 171 in a wavy shape may be formed as the rotation supporting section 114 formed to extend downward from the control knob 110, and the member provided with the ball 173 supported by the spring 172 may be formed as a substrate supporting section 119 configured to support the substrate 150.

In such a case, when a user rotates the control knob 110, the ball 173 supported by the spring 172 may realize stepwise rotation while sliding on the concavo-convex portion 171.

In this case, the plurality of first electrodes 130 formed in the sensor panel 120 is disposed in a position to face the first sensing electrode 151 when the ball 173 slides on the groove of the concavo-convex portion 171.

Also, the concavo-convex portion 171 may also impart a sense of operation to a user who rotates the control knob 110. Also, the concavo-convex portion 171 may be formed in a circumferential direction of the rotation supporting section 114. Further, the concavo-convex portion 171 may be formed in a vertical direction of the rotation supporting section 114. When the concavo-convex portion 171 is formed in a vertical direction of the rotation supporting section 114, the elastic member 118 may have a relatively higher elastic force than the spring 172. Therefore, as the concavo-convex portion 171 moves in a vertical direction of the rotation supporting section 114, the concavo-convex portion 171 may impart a sense of gradual pressing when a user pushes the control knob 110.

According to the embodiments of the present disclosure, there is no need to install two separate modules used to realize a rotary wheel function and a function of measuring a depth in a z-axial direction, and thus productivity may be improved due to a decrease in package size and cost reduction.

Although certain embodiments of the present disclosure have been shown and described, it would be appreciated by those skilled in the art that various changes may be made in these embodiments without departing from the principles and spirit of the disclosure, the scope of which is defined in the claims and their equivalents.

What is claimed is:

1. A control apparatus using a dial, the control apparatus comprising:
   a sensor panel installed to be rotatable and movable up and down;
   a plurality of first electrodes disposed in a surface of the sensor panel, the plurality of first electrodes being spaced apart at a predetermined distance in a circumferential direction;
   a first sensing electrode facing the sensor panel, the first sensing electrode being configured to be capacitively coupled with the plurality of first electrodes to sense a change in capacitance;
   a plurality of second electrodes disposed between adjacent ones of the plurality of first electrodes in the circumferential direction of the sensor panel and having a smaller area than the first electrodes; and
   a second sensing electrode configured to sense a rotation direction of the sensor panel through interaction between the plurality of first electrodes and the plurality of second electrodes when the sensor panel is rotated,
   wherein the first sensing electrode is configured to sequentially react with the plurality of first electrodes to sense a number of rotations of the sensor panel when the sensor panel is rotated and
   to sense a pushing pressure of the sensor panel based on capacitance change values in response to intervals between the sensor panel and the plurality of first electrodes when the sensor panel is pushed
   wherein the second sensing electrode is disposed to face a surface of the sensor panel disposed between the first electrodes and the second electrodes when an external force is not applied to the sensor panel,
   wherein a capacitance value sensed by the second sensing electrode when the second sensing electrode faces the second electrode is smaller than a capacitance value sensed by the second sensing electrode when the second sensing electrode faces the first electrode, and
   wherein the second sensing electrode selectively first faces one of the first electrode and the second electrode according to the rotation direction of the sensor panel to sense the rotation direction of the sensor panel.

2. The control apparatus using a dial according to claim 1, wherein the sensor panel comprises a metal complex, and wherein the plurality of first electrodes is disposed in electrode grooves in the sensor panel.

3. The control apparatus using a dial according to claim 2, wherein the metal complex comprises one or more resins selected from the group consisting of a polycarbonate (PC), a polyamide (PA), and an acrylonitrile-butadiene-styrene (ABS) copolymer, and one or more metal oxides selected from the group consisting of Mg, Cr, Cu, Ba, Fe, Ti, and Al.

4. The control apparatus using a dial according to claim 1, wherein one of the plurality of first electrodes faces the first sensing electrode when an external force is not applied to the sensor panel.

5. The control apparatus using a dial according to claim 4, further comprising:
   a positioning unit configured to position one of the plurality of first electrodes and the first sensing electrode to face each other when an external force is not applied to the sensor panel, wherein the positioning unit comprises a concavo-convex portion formed on a member moving with the sensor panel, and a ball supported by a spring to move along the concavo-convex portion as the sensor panel is rotated.

6. The control apparatus using a dial according to claim 1, wherein the plurality of second electrodes is disposed in electrode grooves in the sensor panel.

7. The control apparatus using a dial according to claim 1, further comprising
a control knob coupled to the sensor panel and comprising a body section,
a grip section disposed along an outer circumference of the body section, and
a rotation supporting section extending from a lower portion of the body section, wherein the rotation supporting section is rotatably press-fitted into a shaft section protruding upward from a base, and
an elastic member configured to apply a pressure to the control knob in an upper direction is disposed between the shaft section and the rotation supporting section.

8. A vehicle comprising a control apparatus using a dial, the control apparatus using a dial comprising:
a sensor panel installed to be rotatable and movable up and down through a user's operation;
a plurality of first electrodes disposed in a surface of the sensor panel to be spaced apart at a predetermined distance in a circumferential direction;
a first sensing electrode facing the sensor panel, the first sensing electrode being configured to be capacitively coupled with the plurality of first electrodes to sense a change in capacitance; and
a control unit electrically connected to the first sensing electrode and configured to receive information transmitted from the first sensing electrode to determine information on capacitance;
a plurality of second electrodes disposed between adjacent ones of the plurality of first electrodes in the circumferential direction of the sensor panel and having a smaller area than the first electrodes; and
a second sensing electrode configured to sense a rotation direction of the sensor panel through interaction between the plurality of first electrodes and the plurality of second electrodes when the sensor panel is rotated,
wherein the first sensing electrode is configured to sequentially react with the plurality of first electrodes to sense a number of rotations of the sensor panel when the sensor panel is rotated and to sense a pushing pressure of the sensor panel based on capacitance change values in response to intervals between the sensor panel and the plurality of first electrodes when the sensor panel is pushed
wherein the second sensing electrode is disposed to face a surface of the sensor panel disposed between the first electrodes and the second electrodes when an external force is not applied to the sensor panel,
wherein a capacitance value sensed by the second sensing electrode when the second sensing electrode faces the second electrode is smaller than a capacitance value sensed by the second sensing electrode when the second sensing electrode faces the first electrode, and
wherein the second sensing electrode selectively first faces one of the first electrode and the second electrode according to the rotation direction of the sensor panel to sense the rotation direction of the sensor panel.

9. The vehicle according to claim 8, wherein the control unit controls operation of one or more of an air conditioning system for vehicles, a clock, an audio device, and a navigation system, based on the information on the capacitance.

10. The vehicle according to claim 8, further comprising:
a positioning unit configured to position one of the plurality of first electrodes and the first sensing electrode to face each other when an external force is not applied to the sensor panel, wherein the positioning unit comprises a concavo-convex portion formed on a member moving with the sensor panel, and a ball supported by a spring to move along the concavo-convex portion as the sensor panel is rotated.

11. The vehicle according to claim 8, further comprising:
a control knob coupled to the sensor panel and comprising a body section,
a grip section disposed along an outer circumference of the body section, and
a rotation supporting section extending from a lower portion of the body section, wherein the rotation supporting section is rotatably press-fitted into a shaft section protruding upward from a base, and
an elastic member configured to apply a pressure to the control knob in an upper direction is disposed between the shaft section and the rotation supporting section.

12. A control apparatus using a dial, the control apparatus comprising:
a sensor panel installed to be rotatable and movable up and down;
a plurality of first electrodes disposed in a surface of the sensor panel, the plurality of first electrodes being arranged in a circumferential direction;
a first sensing electrode facing the sensor panel, the first sensing electrode being configured to be capacitively coupled with the plurality of first electrodes to sense a change in capacitance;
a plurality of second electrodes disposed between adjacent ones of the plurality of first electrodes in the circumferential direction of the sensor panel;
a second sensing electrode configured to sense a rotation direction of the sensor panel through interaction between the plurality of first electrodes and the plurality of second electrodes when the sensor panel is rotated;
a control knob coupled to the sensor panel and comprising a body section;
a grip section disposed along an outer circumference of the body section;
a rotation supporting section extending from a lower portion of the body section; wherein the rotation supporting section is rotatably press-fitted into a shaft section protruding upward from a base; and
an elastic member configured to apply a pressure to the control knob in an upper direction is disposed between the shaft section and the rotation supporting section,
wherein the first sensing electrode is configured to sequentially react with the plurality of first electrodes to sense a number of rotations of the sensor panel when the sensor panel is rotated and
to sense a pushing pressure of the sensor panel based on capacitance change values in response to intervals between the sensor panel and the plurality of first electrodes when the sensor panel is pushed,
wherein the second sensing electrode is disposed to face a surface of the sensor panel disposed between the first electrodes and the second electrodes when an external force is not applied to the sensor panel,
wherein a capacitance value sensed by the second sensing electrode when the second sensing electrode faces the second electrode is smaller than a capacitance value sensed by the second sensing electrode when the second sensing electrode faces the first electrode, and wherein the second sensing electrode selectively first faces one of the first electrode and the second electrode according to the rotation direction of the sensor panel to sense the rotation direction of the sensor panel.

13. The control apparatus using a dial according to claim 12, wherein the sensor panel comprises a metal complex, and wherein the plurality of first electrodes is disposed in electrode grooves in the sensor panel.

14. The control apparatus using a dial according to claim 13, wherein the metal complex comprises one or more resins selected from the group consisting of a polycarbonate (PC), a polyamide (PA), and an acrylonitrile-butadiene-styrene (ABS) copolymer, and one or more metal oxides selected from the group consisting of Mg, Cr, Cu, Ba, Fe, Ti, and Al.

15. The control apparatus using a dial according to claim 12, wherein one of the plurality of first electrodes faces the first sensing electrode when an external force is not applied to the sensor panel.

16. The control apparatus using a dial according to claim 15, further comprising:
a positioning unit configured to position one of the plurality of first electrodes and the first sensing electrode to face each other when an external force is not applied to the sensor panel, wherein the positioning unit comprises a concavo-convex portion formed on a member moving with the sensor panel, and a ball supported by a spring to move along the concavo-convex portion as the sensor panel is rotated.

17. The control apparatus using a dial according to claim 12, wherein the plurality of second electrodes is disposed in electrode grooves in the sensor panel.

* * * * *